United States Patent
Nakamura et al.

[19]

[11] Patent Number: 5,854,493
[45] Date of Patent: Dec. 29, 1998

[54] SUPERCONDUTING DEVICE HAVING AN EXTREMELY SHORT SUPERCONDUCTING CHANNEL FORMED OF OXIDE SUPERCONDUCTOR MATERIAL AND METHOD FOR MANUFACTURING THE SAME

[75] Inventors: Takao Nakamura; Hiroshi Inada; Michitomo Iiyama, all of Osaka, Japan

[73] Assignee: Sumitomo Electric Industries, Ltd., Osaka, Japan

[21] Appl. No.: 843,297

[22] Filed: Apr. 14, 1997

Related U.S. Application Data

[63] Continuation of Ser. No. 400,448, Mar. 7, 1995, abandoned, which is a continuation of Ser. No. 115,805, Sep. 3, 1993, abandoned, which is a continuation of Ser. No. 783,681, Oct. 29, 1991, abandoned.

[30] Foreign Application Priority Data

Oct. 29, 1990 [JP] Japan ..................................... 2-291197
Oct. 29, 1990 [JP] Japan ..................................... 2-291198

[51] Int. Cl.$^6$ ...................................................... H01L 29/06
[52] U.S. Cl. ............................................. 257/39; 505/873
[58] Field of Search ........................... 357/5; 505/1, 700, 505/701, 702, 873, 874, 190–193, 234, 238; 427/62, 63; 257/33, 35, 39, 36, 37, 38, 662, 663

[56] References Cited

U.S. PATENT DOCUMENTS

| 4,831,421 | 5/1989 | Gallagher et al. ........................... 357/5 |
| 5,179,426 | 1/1993 | Iwamatsu et al. ........................ 257/39 |

FOREIGN PATENT DOCUMENTS

| 0324044 | 7/1989 | European Pat. Off. .................. 257/39 |
| 6117983 | 8/1986 | Japan ......................................... 357/5 |
| 01268075 | 10/1989 | Japan ......................................... 357/5 |
| 01308086 | 12/1989 | Japan ......................................... 357/5 |

OTHER PUBLICATIONS

Wu et al, "High Critical Currents in Epitaxial yBa CuO Thin Flims on Silicon with Buffer Layers", Appl. Phys. Lett., vol. 54, #8, Feb. 1989 pp. 754–756.

Linker et al, "Control of Growth Direction of Epitaxial y–Ba—Cu–O Thin Films on SrTi03 Substrates", Solid State Communications, vol. 69, #3, 1989, pp. 249–253.

Primary Examiner—Sara W. Crane
Attorney, Agent, or Firm—Beveridge, DeGrandi, Weilacher & Young, LLP

[57] ABSTRACT

A superconducting device has a substrate, and a superconducting channel provided by an oxide superconductor thin film formed to have an angle with respect to a deposition surface of the substrate. A superconductor source electrode region and a superconductor drain electrode region are formed at opposite ends of the superconducting channel, so that a superconducting current can flow through the superconducting channel between the superconductor source electrode region and the superconductor drain electrode region. A gate electrode region is formed of a oxide superconductor thin film which is deposited in parallel to the deposition surface of the substrate and which has an end portion which abuts with an insulating layer which separates the end portion and the superconducting channel so as to control superconducting current flow through the superconducting channel.

25 Claims, 6 Drawing Sheets

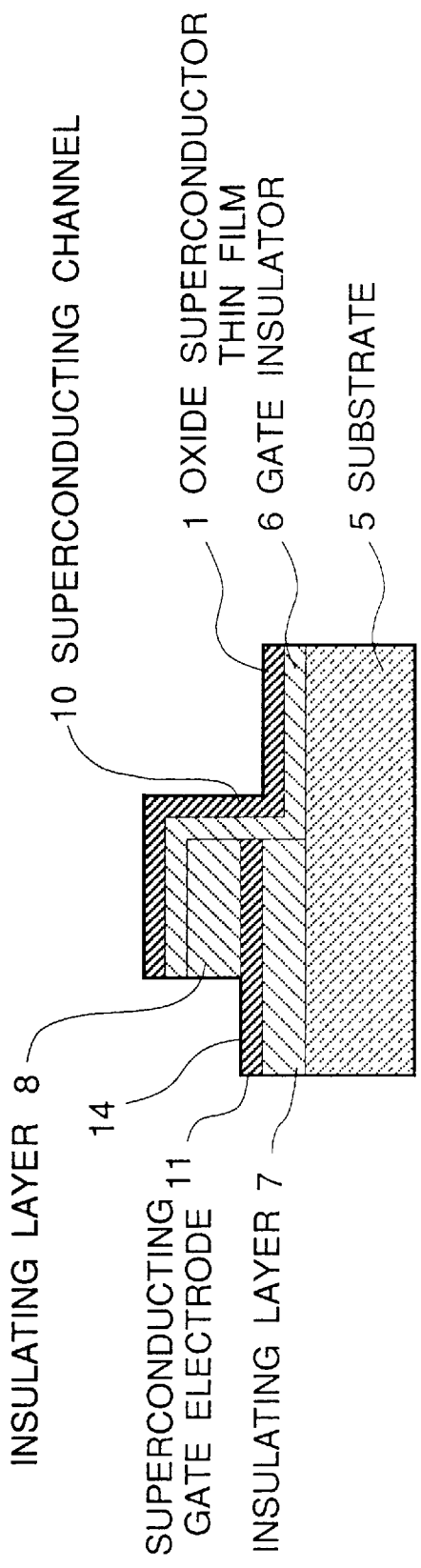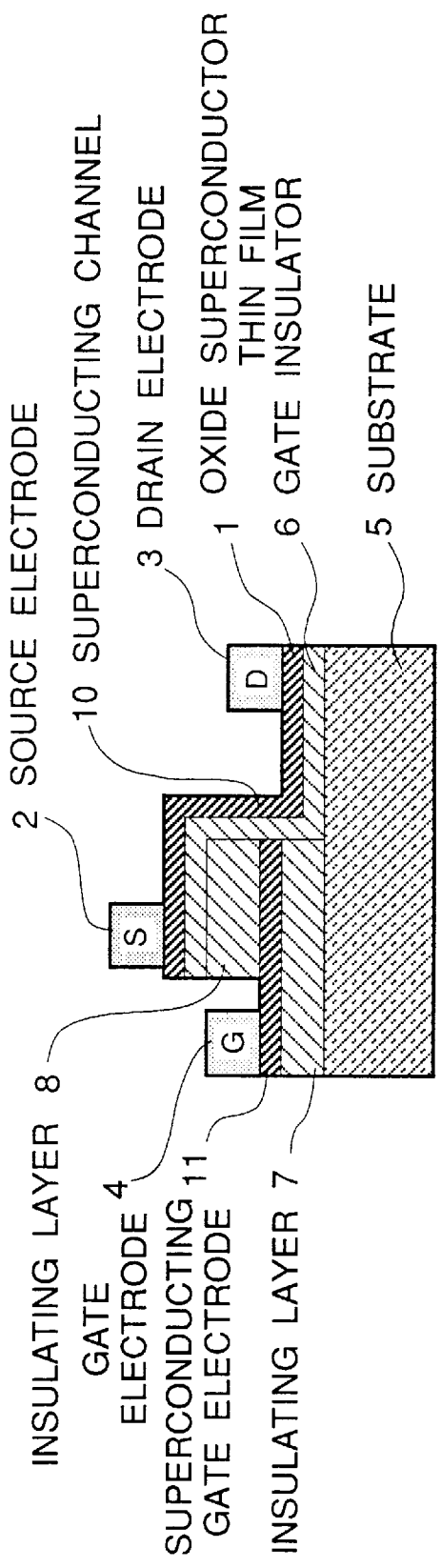

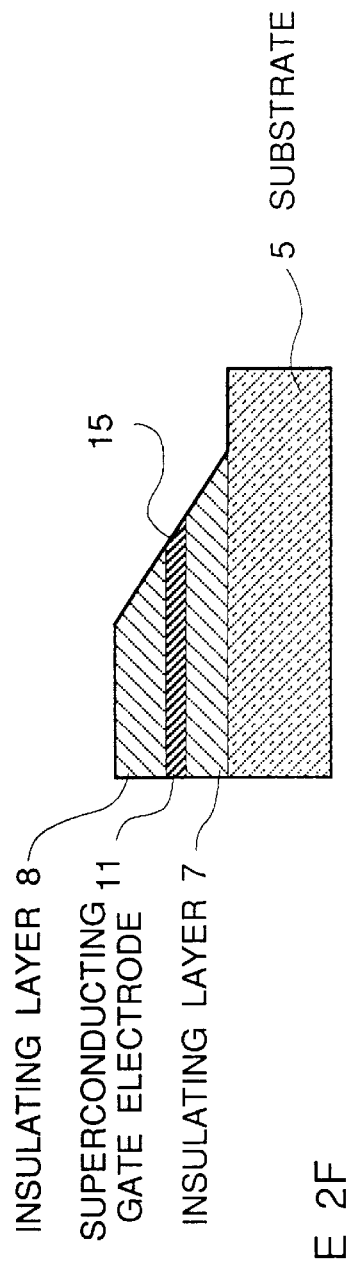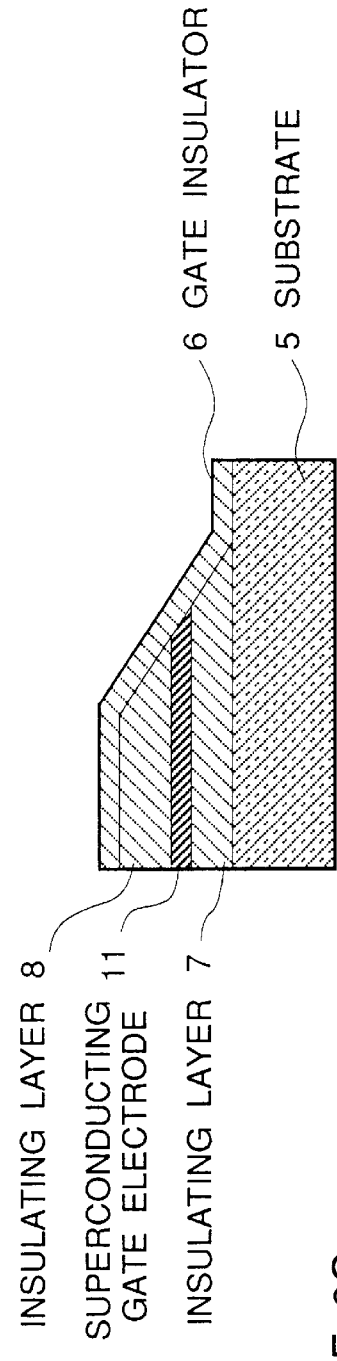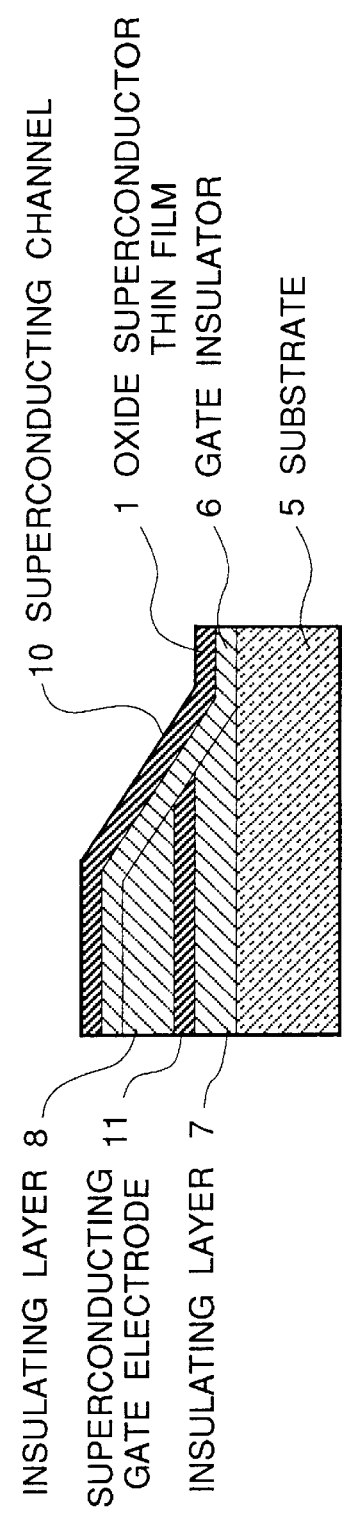

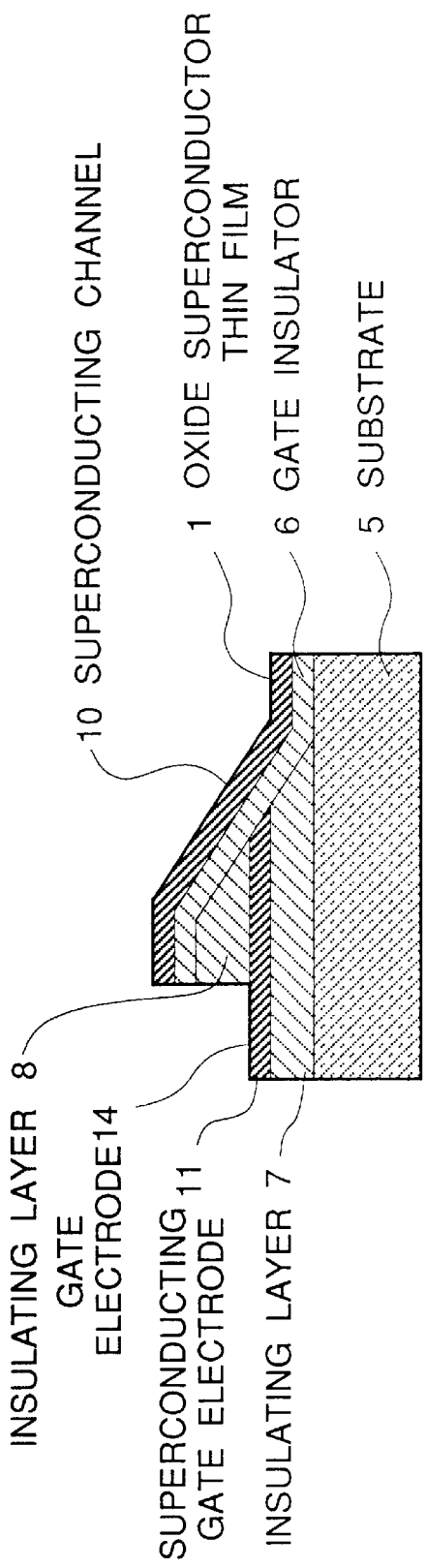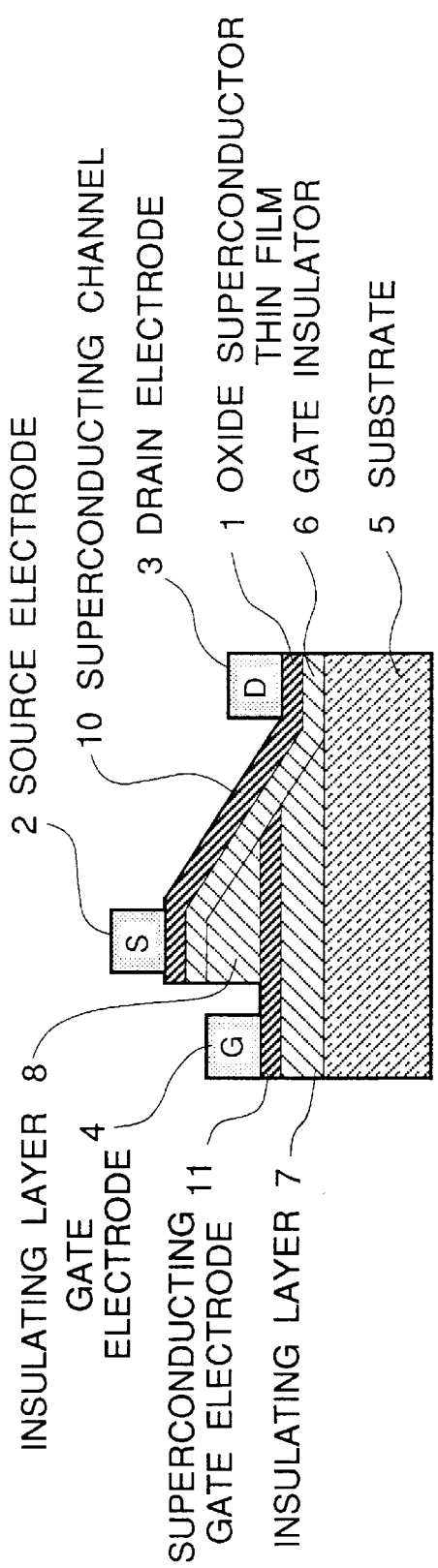

5,854,493

SUPERCONDUTING DEVICE HAVING AN EXTREMELY SHORT SUPERCONDUCTING CHANNEL FORMED OF OXIDE SUPERCONDUCTOR MATERIAL AND METHOD FOR MANUFACTURING THE SAME

This application is a continuation of application Ser. No. 08/400,448, filed Mar. 7, 1995, now abandoned which is a continuation of application Ser. No. 08/115,805, filed Sep. 3, 1993, now abandoned which in turn is a continuation of application Ser. No. 07/783,681, filed on Oct. 29, 1991, now abandoned which application is entirely incorporated herein by reference.

BACKGROUND OF THE INVENTION

1. Field of the Invention

The present invention relates to a superconducting device and a method for manufacturing the same, and more specifically to a superconducting device including an extremely short superconducting channel formed of oxide superconductor material, and a method for manufacturing the same.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulating layer on the recessed or undercut rear surface of the portion of the semiconductor layer between the superconductor source electrode and the superconductor drain electrode.

In the above mentioned super-FET, a superconducting current flows through the semiconductor layer portion between the superconductor source electrode and the superconductor drain electrode due to a proximity effect, and is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the proximity effect, the superconductor source electrode and the superconductor drain electrode have to be located close to each other at a distance which is not greater than a few times the coherence length of the superconductor materials of the superconductor source electrode and the superconductor drain electrode. In particular, since the oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of five nanometers or less.

Furthermore, the operation speed of this device is determined by a gate length. However, it is difficult to realize this dimension of not greater than 0.1 $\mu$m by use of the conventional processing technique, and therefore, there has been a limit in speeding up the operation speed of the device.

SUMMARY OF THE INVENTION

Accordingly, it is an object of the present invention to provide a superconducting device and a method for manufacturing the same, which have overcome the above mentioned defects of the conventional ones.

Another object of the present invention is to provide a superconducting device including a superconducting region constituted of an extremely thin oxide superconductor film, which can be manufactured by using existing established processing techniques with a good repeatability.

Still another object of the present invention is to provide an FET type superconducting device including an extremely short superconducting channel composed of an oxide superconductor thin film, and a method for manufacturing the same with a good repeatability by using existing established processing techniques.

The above and other objects of the present invention are achieved in accordance with the present invention by a superconducting device comprising a substrate, a superconducting channel constituted of an oxide superconductor thin film formed to have an angle to a deposition surface of the substrate, a superconductor source electrode and a superconductor drain electrode formed at opposite ends of the superconducting channel, so that a superconducting current can flow through the superconducting channel between the superconductor source electrode and the superconductor drain electrode, and a gate electrode in the form of a sheet having an end abutted through an insulating layer on the superconducting channel so as to control the superconducting current flowing through the superconducting channel, the gate electrode being formed of an oxide superconductor thin film in parallel to the deposition surface of the substrate.

Here, the source electrode should be understood to include not only an electrode corresponding to the electrode which is called a"source electrode" in the field of a semiconductor MOSFET, but also a source region which is formed adjacent to and continuous to the superconducting channel and on which the source electrode is formed, and the drain electrode should be understood to include not only an electrode corresponding to the electrode which is called a"drain electrode" in the field of the semiconductor MOSFET, but also a drain region which is formed adjacent to and continuous to the superconducting channel and on which the drain electrode is formed.

In addition, the angle of the oxide superconductor thin film of the superconducting channel to the deposition surface of the substrate is determined, in the range of greater than 0° but less than 180°, on the basis of the thickness of the oxide superconductor thin film constituting the gate electrode and the gate length to be obtained. In practice, this angle is preferably not less than 30° but not greater than 90°. Therefore, this angle should be 90° in order to obtain the shortest gate length in a given thickness of the oxide superconductor thin film constituting the gate electrode. However, even if the angle is selected in the range of not less than 30° but not greater than 90°, a desired gate length can be obtained by controlling the thickness of the oxide superconductor thin film constituting the gate electrode.

As seen from the above, the superconducting device in accordance with the present invention is characterized in that the superconducting channel is constituted of the oxide superconductor thin film and formed to have some angle to the deposition surface of the substrate, and in that the gate electrode is formed of the oxide superconductor thin film in parallel to the deposition surface of the deposition surface of the substrate, so that an end of the oxide superconductor thin film of the gate electrode is in contact with the gate insulator so as to oppose through the insulating layer to the superconducting channel. The oxide superconductor thin film of the gate electrode can be formed to have a thickness of not greater than about 100 nm. Therefore, a gate length of the gate electrode is substantially determined by the thickness of the oxide superconductor thin film of the gate electrode. In the super-FET, since the channel length is substantially determined by the gate length of the gate electrode, the super-FET in accordance with the present invention can have an extremely short superconducting channel which is controlled by the gate electrode, and accordingly, the current flowing through the superconducting channel can be turned on and off at a high speed. In addition, the superconducting device in accordance with the present invention can have the above mentioned shortened gate without using the fine-processing technique.

In order to ensure that the superconducting channel can be turned on and off by a voltage applied to the gate electrode, a thickness of the superconducting channel has to be not greater than five nanometers in the direction of an electric field created by the voltage applied to the gate electrode. This extremely thin superconducting channel is realized in the superconducting device in accordance with the present invention.

Furthermore, differently from the conventional super-FET in which a superconducting current flows through the semiconductor channel due to the superconducting proximity effect, the superconducting device in accordance with the present invention is constructed so that a main current flows through the superconductor material. Therefore, the superconducting device in accordance with the present invention is not required to locate the pair of superconducting electrodes apart from each other by an extremely short distance. In addition, in the superconducting device in accordance with the present invention, the shortened gate can be formed without using the fine-processing technique as mentioned above, and the superconducting channel can be also formed without using the fine-processing technique as will be explained hereinafter. Therefore, the limitation in the fine processing techniques required for manufacturing the super-FET can be relaxed.

The above mentioned superconducting device in accordance with the present invention can be formed by the method in accordance with the present invention for manufacturing the superconducting device, which method includes the step of forming and stacking a first oxide superconducting thin film and a first insulting layer on an insulting surface of a substrate in the name order partially removing the stacked structure of the first oxide superconducting thin film and the first insulting layer so as to have a smooth continuous end surface having an angle to the insulting surface of a substrate and extending from the first insulting layer at least to a bottom surface of the first oxide superconducting thin film, and forming and stacking a second insulting layer and a second oxide superconducting thin film in the name order on the end surface of the stacked structure of the first oxide superconducting thin film and the first insulting layer, so that the first oxide superconducting thin film functions as a gate electrode and the second insulting layer functions as a gate insulator and so that a first portion of the second oxide superconducting thin film joining to the end surface of the first oxide superconducting thin film through the second insulting layer forms a superconducting channel, and second and third portions of the second oxide superconducting thin film at both sides of the first portion of the second oxide superconducting thin film form a source and a drain, respectively.

As seen from the above, in the method of the present invention, the first oxide superconducting thin film constituting the superconducting gate electrode is first formed on the substrate. In this connection, a film of an insulator such as MgO can be formed on the substrate if necessary, and thereafter, the first oxide superconducting thin film can be formed on the insulator film.

Then, the first insulting layer is deposited on the first oxide superconducting thin film, and the stacked structure of the first oxide superconducting thin film and the first insulting layer is partially etched to have a smooth continuous end surface having an angle to the deposition surface of the substrate and extending from the first insulting layer at least to a bottom surface of the first oxide superconducting thin film. This etching can be performed by using, preferably, a scan type etching such as a focused ion beam etching. Thereafter, a second insulting layer constituting the gate insulator and the second oxide superconductor thin film constituting the superconducting channel are formed on the end surface of the stacked structure of the first oxide superconducting thin film and the first insulting layer.

The oxide superconductor thin film constituting the superconducting channel has to have a thickness on the order of about five nanometers or less. Such an extremely thin oxide superconductor thin film can be formed in a conventional process by precisely controlling the growth speed and the growth time of the thin film. For this purpose, a sputtering can be used. However, since the oxide superconductor crystal has a multi-layer structure in which respective constituent elements are stacked in a layered structure, it is possible to stack a desired number of unit cells of oxide superconductor, by using a MBE (molecular beam epitaxy).

In the method in accordance with the present invention for manufacturing the superconducting device, there is neither a fine-etching nor a fine-patterning of the superconducting thin film. Therefore, it is possible to relax the limitation in the fine processing techniques such as a fine-etching or a fine-patterning which has been required in the case that conventional super-FET is formed of an oxide superconductor material. In addition, the stacked structure of the oxide superconducting layer and the semiconductor layer is no longer necessary.

In a preferred embodiment of the superconducting device in accordance with the present invention, the oxide superconductor thin films is formed of a high-Tc (high critical temperature) oxide superconductor material. This high-Tc oxide superconductor material has been studied by many researchers since the discovery of Bednorz and Müller in 1986, and is said to indicate an oxide superconductor material having a critical temperature of not less than 30K. More specifically, the oxide superconductor thin film is formed of a high-Tc copper-oxide type oxide superconductor material including a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate, on which the oxide superconductor thin film is deposited, can be formed of an insulating substrate, preferably an oxide single crystalline substrate such as MgO, $SrTiO_3$, and $CdNdAlO_4$. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if a silicon substrate is used.

The above and other objects, features and advantages of the present invention will be apparent from the following description of preferred embodiments of the invention with reference to the accompanying drawings.

BRIEF DESCRIPTION OF THE DRAWINGS

FIGS. 1A to 1I are diagrammatic sectional views for illustrating a first embodiment of the process in accordance with the present invention for manufacturing the super-FET; and FIGS. 2A to 2I are diagrammatic sectional views for illustrating a second embodiment of the process in accordance with the present invention for manufacturing the super-FET.

DESCRIPTION OF THE PREFERRED EMBODIMENTS

Embodiment 1

Referring to FIGS. 1A to 1I, a first embodiment of the process in accordance with the present invention for manufacturing the super-FET will be described.

Figure 1A:
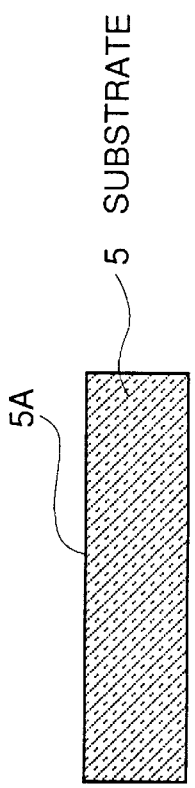

First, a substrate 5 is prepared as shown in FIG. 1A. This substrate 5 is formed of for example, an insulating substrate such as a MgO (100) substrate, a $SrTiO_3$ (100) substrate or others, or a semiconductor substrate such as a silicon (100) substrate having a principal surface coated with insulating films. However, if the semiconductor substrate is used, a principal surface of the semiconductor substrate is continuously coated with $MgAl_2O_4$ by a CVD process and with $BaTiO_3$ by a sputtering process.

Figure 1B:
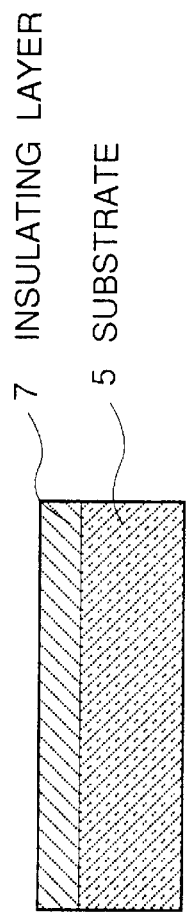

Then, as shown in FIG. 1B, an insulating layer 7 such as a MgO and others is deposited on a principal surface or deposition surface 5A of the substrate 5 by a sputtering process, so as to have a thickness of about 200 nm. However, if the substrate has good insulation property and good crystallinity, the insulating layer 7 can be omitted.

Figure 1C:
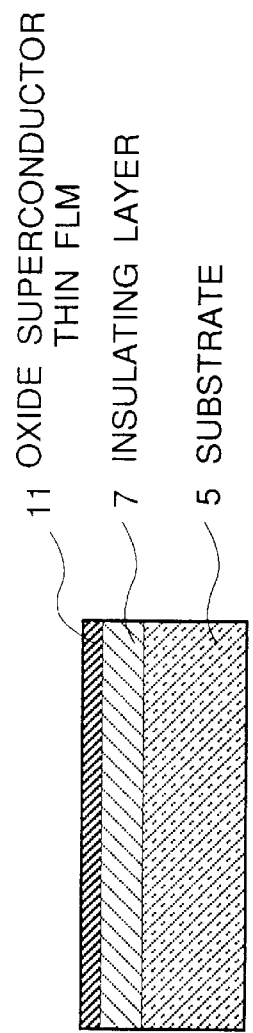
Figure 1D:
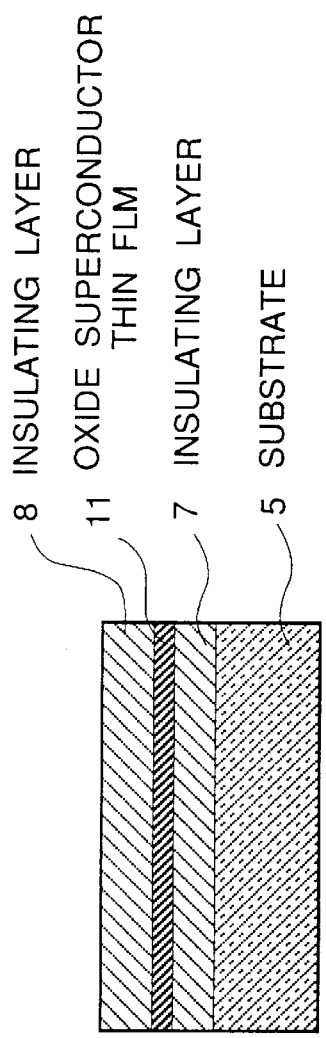

Then, as shown in FIG. 1C, a c-axis orientated oxide superconductor thin film 11, which has a thickness of not greater than about 100 nm and which will form a superconducting gate electrode, is deposited on the insulating layer 7, by for example an off-axis sputtering, a reactive evaporation, an MBE (molecular beam epitaxy), a CVD, etc. The oxide superconductor material is preferably formed of, for example, a Y—Ba—Cu—O type compound oxide superconductor material, a Bi—Sr—Ca—Cu—O type compound oxide superconductor material, and a Tl—Ba—Ca—Cu—O type compound oxide superconductor material. The c-axis orientated oxide superconductor thin film has a large critical current density in a direction parallel to the substrate.

Figure 2A:
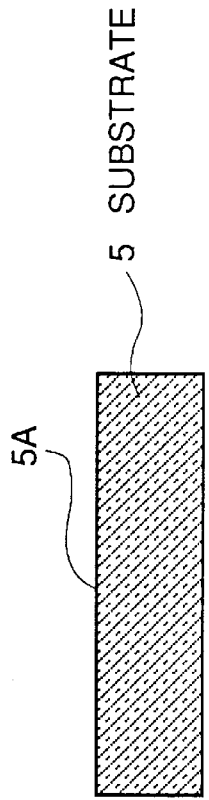
Figure 2B:
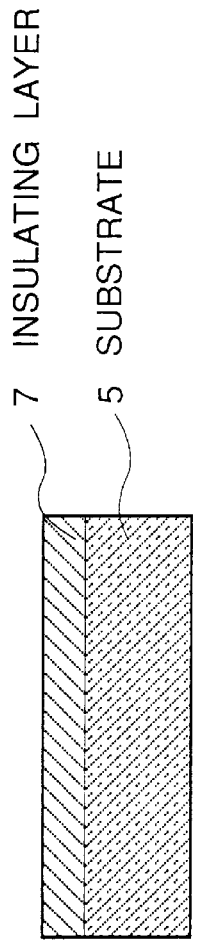
Figure 2C:
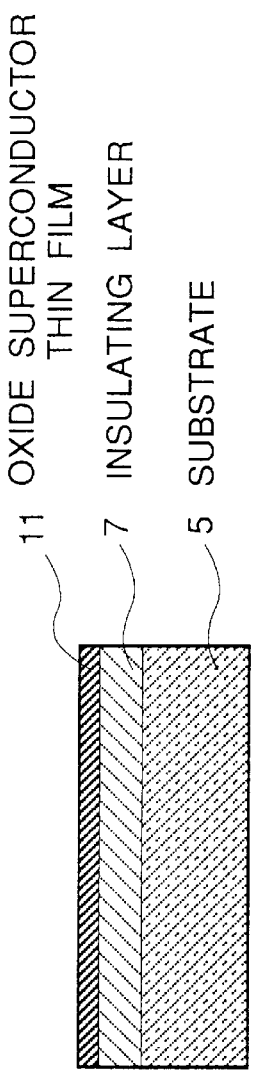
Figure 2D:
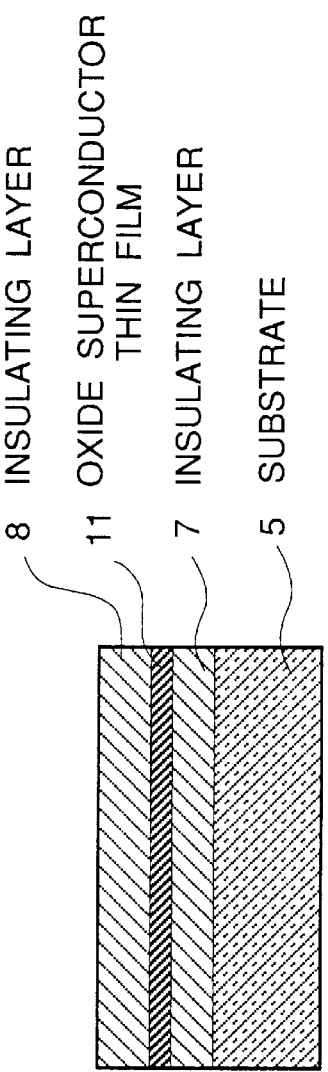

As shown in FIG. 2D, an insulating layer 8 such as a MgO and others is deposited on the principal surface of the oxide superconductor thin film 11 by a sputtering process, so as to have a thickness of about 300 nm. In order to reduce a mechanical stress, it is preferred that the insulating layer 7, the oxide superconductor thin film 11 and the insulating layer 8 are continuously deposited without being taken out of a deposition chamber.

Figure 1E:
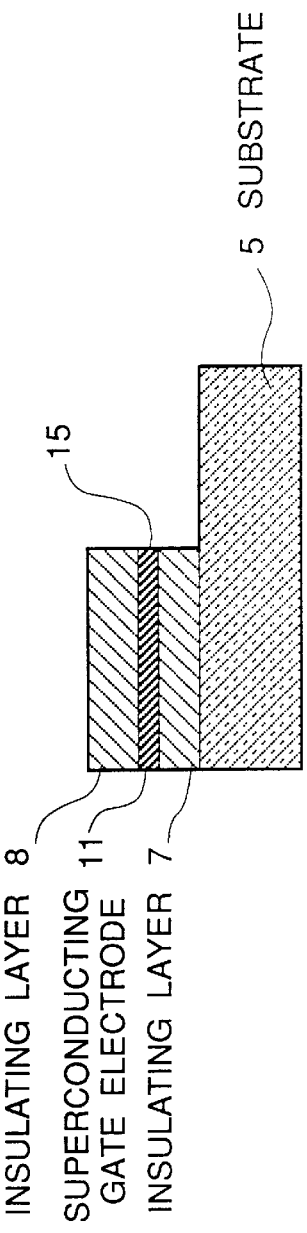

Thereafter, as shown in FIG. 1E, the right portion (in the drawing) of a stacked structure of the insulating layer 7, the oxide superconductor thin film 11 and the insulating layer 8 is completely removed by an etching process, so that the stacked structure has a vertical end surface 15 extending from an upper surface of the insulating layer 8 to a bottom surface of the insulating layer 7, and a right portion of the substrate 5 is exposed. The end surface 15 is perpendicular to the principal surface or deposition surface 5A of the substrate 5. This etching is performed by using a scan type etching such as a focused ion beam etching.

Figure 1F:
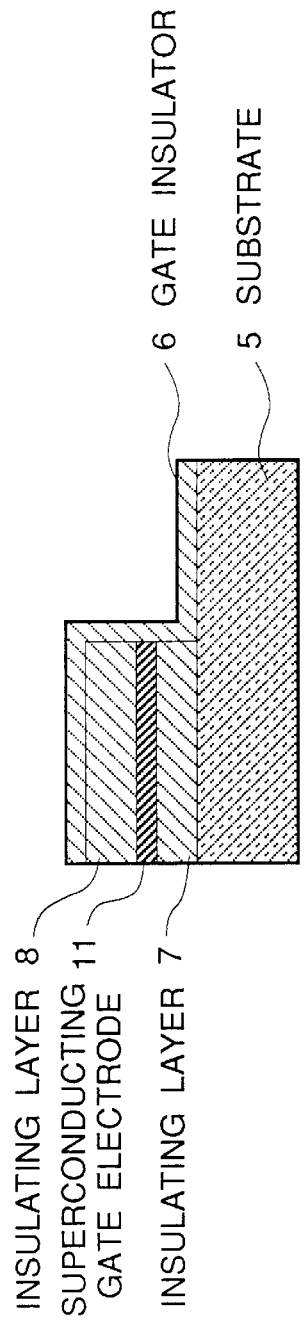

As shown in FIG. 1F, a gate insulator layer 6 is formed to cover the vertical end surface 15, an upper surface of the insulating layer 8, and the exposed surface of the substrate 5. The gate insulator layer 6 is formed of, for example, MgO, $Si_3N_4$, etc., and has a thickness sufficient to prevent a tunnel current, for example, a thickness of not less than 10 nanometers.

Figure 1G:
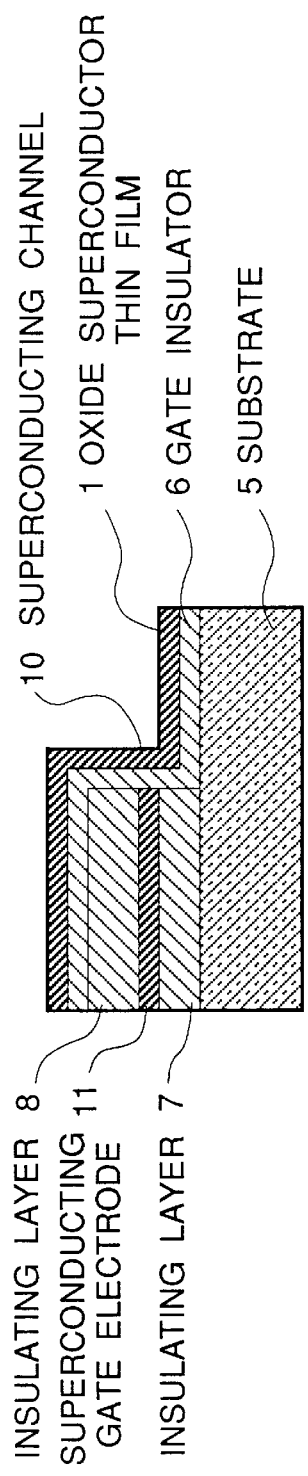

As shown in FIG. 1G, an a-axis orientated oxide superconductor thin film 1 is deposited on the gate insulator layer 6 by an off-axis sputtering at a temperature of not greater than 650° C. This oxide superconductor thin film 1 is formed of the same oxide superconductor material as that of the oxide superconductor thin film 11 and has a thickness of not greater than 5 nm. Therefore, since a portion of the oxide superconductor thin film 1 deposited above the upper surface of the insulating layer 8 and the exposed surface of the substrate 5 has the a-axis perpendicular to the principal surface or deposition surface 5A of the substrate 5, a portion of the oxide superconductor thin film 1 deposited above the vertical end surface 15 has the a-axis in parallel to the vertical end surface and therefore has a large critical current density in a direction parallel to the vertical end surface 15.

As shown in FIG. 1H, a left end portion (in the drawing) of the oxide superconductor thin film 1, the gate insulator layer 6 and the insulating layer 8 is removed by a reactive ion etching or an Ar ion milling, so that a left end portion 14 of the superconducting gate electrode 11 is exposed.

Thereafter, as shown in FIG. 1I, a gate electrode 4, a source electrode 2 and a drain electrode 3 are formed on the exposed left end portion 14 of the superconducting gate electrode 11, and opposite end portions of the the oxide superconductor thin film 1, respectively. These electrodes are preferably formed of a refractory metal such as Ti, W, etc., or Au, or a silicide thereof, by any appropriate process such as a vacuum evaporation process. In addition, if necessary, a passivation film can be formed to cover these electrodes. With this, the super-FET is completed.

According to the first embodiment of the method of the present invention, the limitation in the fine processing technique required for manufacturing the super-FET is relaxed. Accordingly, it is easy to manufacture the super-FET with good repeatability, and the manufactured super-FET has a stable performance.

As seen from the above description and shown in FIG. 1I, the first embodiment of the super-FET in accordance with the present invention includes the superconducting gate electrode 11 of the oxide superconductor material stacked on the insulating layer 7 formed on the substrate 5. The gate electrode 4 is formed on the left portion of the superconducting gate electrode 11. On the other hand, the superconducting gate electrode 11 has a right portion having an upper surface coated with the insulating layer 8, so that the insulating layer 7, the superconducting gate electrode 11 and the insulating layer 8 form the stacked structure.

The stacked structure of the insulating layer 7, the superconducting gate electrode 11 and the insulating layer 8 has a single common right end surface 15 perpendicular to the principal surface or deposition surface 5A of the substrate 5. On the perpendicular right end surface 15, the gate insulator layer 6 and the oxide superconductor thin film 1 are formed in the named order, and the gate insulator layer 6 and the oxide superconductor thin film 1 extend continuously to extend on the upper surface of the insulating layer 8 and the upper surface of the substrate 5.

With this arrangement, a portion of the oxide superconductor thin film 1 positioned just in front of the end of the superconducting gate electrode 11, forms a superconducting channel 10. This superconducting channel 10 has a large critical current density along a current flowing direction within the superconducting channel 10, since as mentioned above the portion of the oxide superconductor thin film 1 deposited above the vertical end surface 15 has the a-axis in parallel to the vertical end surface and therefore has a large critical current density in a direction parallel to the vertical end surface 15. The source electrode 2 and the drain electrode 3 are formed on opposite end portions of the oxide superconductor thin film 1.

Embodiment 2

Referring to FIGS. 2A to 2I, a second embodiment of the process in accordance with the present invention for manufacturing the super-FET will be described. In FIGS. 2A to 2I, the elements similar or corresponding to those shown in FIGS. 1A to 1I are given the same Reference Numerals, and only portions or steps different from those of the first embodiments will be explained.

The same processes as those shown in FIGS. 1A to 1D are performed in steps shown in FIG. 2A to 2D.

The process shown in FIG. 2E is different from that shown in FIG. 1E, only in that an inclined end surface 15 is formed in the process shown in FIG. 2E, in place of the vertical end surface shown in FIG. 1E.

Namely, as shown in FIG. 2E, an right portion (in the drawing) of a stacked structure of the insulating layer 7, the oxide superconductor thin film 11 and the insulating layer 8 is removed by an etching process so as to have a common single inclined end surface 15, and a right portion of the substrate 5 is exposed. This etching is performed by using a scan type etching such as a focused ion beam etching.

As shown in FIG. 2F, a gate insulator layer 6 is formed to cover the inclined end surface 15, an upper surface of the insulating layer 8, and the exposed surface of the substrate 5. The gate insulator layer 6 is formed of, for example, MgO, $Si_3N_4$, etc., and has a thickness sufficient to prevent a tunnel current, for example, a thickness of not less than 10 nanometers.

As shown in FIG. 2G, a c-axis orientated oxide superconductor thin film 1 is deposited on the gate insulator layer 6 by an off-axis sputtering at a temperature of about 700° C. This oxide superconductor thin film 1 is formed of the same oxide superconductor material as that of the oxide superconductor thin film 11 and has a thickness of not greater than 5 nm. A portion of the oxide superconductor thin film 1 deposited above the inclined end surface 15 has the c-axis perpendicular to the inclined end surface and therefore has a large critical current density in a direction parallel to the inclined end surface 15.

As shown in FIG. 2H, a left end portion (in the drawing) of the oxide superconductor thin film 1, the gate insulator layer 6 and the insulating layer 8 is removed by a reactive ion etching or an Ar ion milling, so that a left end portion 14 of the superconducting gate electrode 11 is exposed.

Thereafter, as shown in FIG. 2I, a gate electrode 4, a source electrode 2 and a drain electrode 3 are formed on the exposed left end portion 14 of the superconducting gate electrode 11, and opposite end portions of the the oxide superconductor thin film 1, respectively. These electrodes are preferably formed of a refractory metal such as Ti, W, etc., or Au, or a silicide thereof, by any appropriate process such as a vacuum evaporation process. In addition, if necessary, a passivation film can be formed to cover these electrodes. With this, the super-FET is completed.

According to the second embodiment of the method of the present invention, the limitation in the fine processing technique required for manufacturing the super-FET is also relaxed. Accordingly, it is easy to manufacture the super-FET with good repeatability, and the manufactured super-FET has a stable performance.

As seen from the above description and shown in FIG. 2I, the second embodiment of the super-FET in accordance with the present invention includes the superconducting gate electrode 11 of the oxide superconductor material stacked on the insulating layer 7 formed on the substrate 5. The gate electrode 4 is formed on the left portion of the superconducting gate electrode 11. On the other hand, the superconducting gate electrode 11 has a right portion having an upper surface coated with the insulating layer 8 so that the insulating layer 7, the superconducting gate electrode 11 and the insulating layer 8 form the stacked structure.

The stacked structure of the insulating layer 7, the superconducting gate electrode 11 and the insulating layer 8 has a single common end surface 15 inclined to the principal surface or deposition surface 5A of the substrate 5. On the inclined right end surface 15, the gate insulator layer 6 and the oxide superconductor thin film 1 are formed in the named order so as to continuously extend on the upper surface of the insulating layer 8 and the upper surface of the substrate 5.

With this arrangement, a portion of the oxide superconductor thin film 1 positioned just in front of the end of the superconducting gate electrode 11, forms a superconducting channel 10. This superconducting channel 10 has a large critical current density along a current flowing direction within the superconducting channel 10, since as mentioned above the portion of the oxide superconductor thin film 1 deposited above the inclined end surface 15 has the c-axis perpendicular to the inclined end surface and therefore has a large critical current density in a direction parallel to the inclined end surface 15. The source electrode 2 and the drain electrode 3 are formed on opposite end portions of the oxide superconductor thin film 1.

In addition, in order to obtain a gate length of 100 nm in the second embodiment, if the inclined end surface 15 has an angle of 30° to the deposition surface of the substrate 5, the oxide superconductor thin film 11 forming the superconducting gate electrode is deposited to have a thickness of 50 nm. Similarly, the angle of the inclined end surface 15 to the deposition surface 5A of the substrate 5 and the thickness of the oxide superconductor thin film 11 constituting the gate electrode is determined on the basis of the gate length to be obtained.

As explained above, in the superconducting device in accordance with the present invention, a main current flows through the superconducting channel and is controlled by the gate voltage. Therefore, differently from the conventional super-FET in which a superconducting current flows through the semiconductor channel due to the superconducting proximity effect, the fine processing techniques which had been required for manufacturing the super-FET have become unnecessary. In addition, since it is not necessary to stack the superconductor and the semiconductor, high performance superconducting device can be realized by using an oxide superconductor. Furthermore, since the gate length can be shortened, the superconducting device in accordance with the present invention can operate at a high speed. Therefore, the application of the superconduction technology to the electronic devices can be promoted.

The invention has thus been shown and described with reference to the specific embodiments. However, it should be noted that the present invention is in no way limited to the details of the illustrated structures but changes and modifications may be made within the scope of the appended claims.

We claim:

1. A superconducting device which controls current flow within a superconducting channel thereof in accordance with a gate voltage applied to a gate electrode region of said device, said device comprising:

a substrate, a first oxide superconductor thin film situated at an angle with respect to a deposition surface of said substrate, said first oxide superconductor thin film having a thickness of not greater than 5 nm and defining said superconducting channel, a superconductor source electrode region and a superconductor drain electrode region formed at opposite ends of said superconducting channel, so that a superconducting current can flow through said superconducting channel between said superconductor source electrode region and said superconductor drain electrode region, a second oxide superconductor thin film situated parallel to said deposition surface of said substrate, the second oxide superconductor thin film defining said gate electrode region, and a first insulating layer which separates said superconducting channel and said gate electrode region and which prevents tunnel current therebetween, said gate electrode region having an end portion which abuts said first insulating layer and being formed at only one side of the superconducting channel.

2. A superconducting device as claimed in claim 1 wherein said device includes a second insulating layer formed on said deposition surface of said substrate and a third insulating layer, said second oxide superconductor thin film being formed on said second insulating layer, and said third insulating layer being formed on said second oxide superconductor thin film so that a stacked structure is formed by said second insulating layer, said second oxide superconductor thin film and said third insulating layer, and said first oxide superconductor thin film is formed on an end surface portion of said stacked structure.

3. A superconducting device as claimed in claim 1 wherein said second oxide superconductor thin film defining said gate electrode region has a thickness of not greater than 100 nm.

4. A superconducting device as claimed in claim 1 wherein said second oxide superconductor thin film defining said gate electrode region has a c-axis perpendicular to said deposition surface of said substrate.

5. A superconducting device as claimed in claim 2 wherein said angle is 90° and said first oxide superconductor thin film defining said superconducting channel and formed on said end surface portion has an a-axis parallel to said end surface portion.

6. A superconducting device as claimed in claim 2 wherein said angle is less than 90° and said first oxide superconductor thin film defining said superconducting channel and formed on said end surface portion has a c-axis perpendicular to said end surface portion.

7. A superconducting device as claimed in claim 1 wherein said first and second oxide superconductor thin films are formed of a high-Tc oxide superconductor material.

8. A superconducting device as claimed in claim 1 wherein said first and second oxide superconductor thin films are formed of a high-Tc copper-oxide type oxide superconductor material.

9. A superconducting device as claimed in claim 8 wherein said first and second oxide superconductor thin films are formed of the same material, which same material is selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

10. A superconducting device as claimed in claim 1 wherein said substrate is formed of a material selected from the group consisting of a MgO (100) substrate, a $SrTiO_3$ (100) substrate and a $CdNdAlO_4$ (001) substrate, and a semiconductor substrate.

11. A superconducting device as claimed in claim 1 wherein said substrate is formed of a silicon substrate and a principal surface of the silicon substrate is coated with insulating material layers which are formed of a $MgAl_2O_4$ layer and a $BaTiO_3$ layer.

12. A superconducting device as claimed in claim 1, wherein said drain electrode region does not extend under said gate electrode region.

13. A superconducting device which controls current flow within a superconducting channel thereof in accordance with a gate voltage applied to a gate electrode region of said device, said device comprising:

a substrate, a first oxide superconductor thin film situated at an angle with respect to a deposition surface of said substrate, said first oxide superconductor thin film having a thickness of not greater than 5 nm and defining said superconducting channel, a superconductor source electrode region and a superconductor drain electrode region formed at opposite ends of said superconducting channel, so that a superconducting current can flow through said superconducting channel between said superconductor source electrode region and said superconductor drain electrode region, a second oxide superconductor thin film situated parallel to said deposition surface of said substrate, the second oxide superconductor thin film defining said gate electrode region, and a first insulating layer which separates said superconducting channel and said gate electrode region and which prevents tunnel current therebetween, said gate electrode region having an end portion which abuts said first insulating layer, said gate voltage being applied to said gate electrode region such that an electric field produced by said gate voltage forms a depletion region within said superconducting channel without forming a Josephson junction.

14. A superconducting device as claimed in claim 13 wherein said device includes a second insulating layer formed on said deposition surface of said substrate and a third insulating layer, said second oxide superconductor thin film being formed on said second insulating layer, and said third insulating layer being formed on said second oxide superconductor thin film so that a stacked structure is formed by said second insulating layer, said second oxide superconductor thin film and said third insulating layer, and said first oxide superconductor thin film is formed on an end surface portion of said stacked structure.

15. A superconducting device as claimed in claim 13 wherein said second oxide superconductor thin film defining said gate electrode region has a thickness of not greater than 100 nm.

16. A superconducting device as claimed in claim 17 wherein said second oxide superconductor thin film defining said gate electrode region has a c-axis perpendicular to said deposition surface of said substrate.

17. A superconducting device as claimed in claim 14 wherein said angle is 90° and said first oxide superconductor thin film defining said superconducting channel and formed on said end surface portion has an a-axis parallel to said end surface portion.

18. A superconducting device as claimed in claim 18 wherein said angle is less than 90° and said first oxide superconductor thin film defining said superconducting channel and formed on said end surface portion has a c-axis perpendicular to said end surface portion.

19. A superconducting device as claimed in claim 13 wherein said first and second oxide superconductor thin films are formed of a high-Tc oxide superconductor material.

20. A superconducting device as claimed in claim 13 wherein said first and second oxide superconductor thin films are formed of a high-Tc copper-oxide type oxide superconductor material.

21. A superconducting device as claimed in claim 20 wherein said first and second oxide superconductor thin films are formed of the same material, which same material is selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

22. A superconducting device as claimed in claim 13 wherein said substrate is formed of a material selected from the group consisting of a MgO (100) substrate, a $SrTiO_3$ (100) substrate and a $CdNdAlO_4$ (001) substrate, and a semiconductor substrate.

23. A superconducting device as claimed in claim 13 wherein said substrate is formed of a silicon substrate and a principal surface of the silicon substrate is coated with insulating material layers which are formed of a $MgAl_2O_4$ layer and a $BaTiO_3$ layer.

24. A superconducting device as claimed in claim 13, wherein said gate electrode region is located on only one side of said superconducting channel.

25. A superconducting device as claimed in claim 13, wherein said drain electrode region does not extend under said gate electrode region.

* * * * *